United States Patent
Cole et al.

(10) Patent No.: US 11,170,543 B2
(45) Date of Patent: Nov. 9, 2021

(54) MRI IMAGE RECONSTRUCTION FROM UNDERSAMPLED DATA USING ADVERSARIALLY TRAINED GENERATIVE NEURAL NETWORK

(71) Applicant: The Board of Trustees of the Leland Stanford Junior University, Stanford, CA (US)

(72) Inventors: Elizabeth K. Cole, Stanford, CA (US); Shreyas S. Vasanawala, Stanford, CA (US); Frank Ong, Los Altos, CA (US); John M. Pauly, Stanford, CA (US)

(73) Assignee: The Board of Trustees of the Leland Stanford Junior University, Stanford, CA (US)

(*) Notice: Subject to any disclaimer, the term of this patent is extended or adjusted under 35 U.S.C. 154(b) by 86 days.

(21) Appl. No.: 16/740,655

(22) Filed: Jan. 13, 2020

(65) Prior Publication Data
US 2021/0217213 A1 Jul. 15, 2021

(51) Int. Cl.
*G06T 11/00* (2006.01)
*G06T 5/10* (2006.01)
*G06N 3/08* (2006.01)

(52) U.S. Cl.
CPC .............. *G06T 11/006* (2013.01); *G06N 3/08* (2013.01); *G06T 5/10* (2013.01); *G06T 2207/10088* (2013.01); *G06T 2207/20081* (2013.01); *G06T 2207/20084* (2013.01); *G06T 2210/41* (2013.01)

(58) Field of Classification Search
USPC .................................................. 382/128, 131
See application file for complete search history.

(56) References Cited

U.S. PATENT DOCUMENTS

| 8,855,431 B2 | 10/2014 | Donoho | |
|---|---|---|---|
| 9,846,214 B2* | 12/2017 | Zhou | G01R 33/5611 |
| 10,393,842 B1 | 8/2019 | Cheng | |
| 10,810,767 B2* | 10/2020 | Mailhe | G06N 3/0445 |
| 10,859,657 B2* | 12/2020 | Gong | G01R 33/5611 |
| 10,902,651 B2* | 1/2021 | Huang | G06N 3/08 |
| 2016/0187446 A1 | 6/2016 | Zhou | |
| 2017/0309019 A1 | 10/2017 | Knoll | |
| 2018/0285695 A1* | 10/2018 | Guo | G06T 7/0012 |
| 2019/0096035 A1* | 3/2019 | Li | G06T 3/4053 |

(Continued)

OTHER PUBLICATIONS

Malkiel et al., Conditional WGANs with Adaptive Gradient Balancing for sparse MRI Reconstruction, May 2, 2019, arXiv: 1905.00985v1 [cs.LG], pp. 1-13 (Year: 2019).*

(Continued)

*Primary Examiner* — Ishrat I Sherali
(74) *Attorney, Agent, or Firm* — Lumen Patent Firm

(57) ABSTRACT

A method of magnetic resonance imaging acquires undersampled MRI data and generates by an adversarially trained generative neural network MRI data having higher quality without using any fully-sampled data as a ground truth. The generative neural network is adversarially trained using a discriminative neural network that distinguishes between undersampled MRI training data and candidate undersampled MRI training data produced by applying an MRI measurement function containing an undersampling mask to generated MRI training data produced by the generative neural network from the undersampled MRI training data.

10 Claims, 7 Drawing Sheets

(56) References Cited

U.S. PATENT DOCUMENTS

| | | | |
|---|---|---|---|
| 2019/0172230 A1* | 6/2019 | Mailhe | G06N 3/084 |
| 2019/0236817 A1 | 8/2019 | Cheng | |
| 2019/0266761 A1* | 8/2019 | Malkiel | G06T 11/008 |
| 2019/0369191 A1* | 12/2019 | Gong | G01R 33/5608 |
| 2020/0034948 A1* | 1/2020 | Park | A61N 5/1039 |
| 2020/0134887 A1* | 4/2020 | Zeng | G06N 3/088 |
| 2020/0202586 A1* | 6/2020 | Li | G01R 33/4818 |
| 2020/0408864 A1* | 12/2020 | Mailhe | G06N 3/088 |
| 2021/0118197 A1* | 4/2021 | Gao | G06K 9/6267 |
| 2021/0158583 A1* | 5/2021 | Huang | G01R 33/561 |

OTHER PUBLICATIONS

Jiang et al., Accelerating CS-MRI Reconstruction With Fine-Tuning Wasserstein Generative Adversarial Network, Oct. 2019, IEEE, vol. 7, 2019, p. 12347-152357. (Year: 2019).*

Cole et al., Unsupervised MRI Reconstruction with Generative Adversarial Networks, IEEE Aug. 29, 2020 paper submitted for review., pp. 1-10. (Year: 2020).*

Lei et al., Wasserstein GANs for MR Imaging: from Paired to Unpaired Training. arXiv:1910.07048v1 [eess.IV] Oct. 15, 2019.

Bora et al., AmbientGAN: Generative Models from Lossy Measurements. International Conference on Learning Representations (ICLR) 2018.

Yaman et al., Self-Supervised Physics-Based Deep Learning Reconstruction without Fully-sampled Data. arXiv:1910.09116v1 [eess.IV] Oct. 21, 2019.

Tamir et al., Unsupervised Deep Basis Pursuit: Learning inverse problems without ground-truth data. arXiv:1910.13110v1 [eess.SP] Oct. 29, 2019.

Zhussip et al., Training deep learning based image denoisers from undersampled measurements. arXiv:1806.00961v2 [cs.CV] Dec. 19, 2018.

* cited by examiner

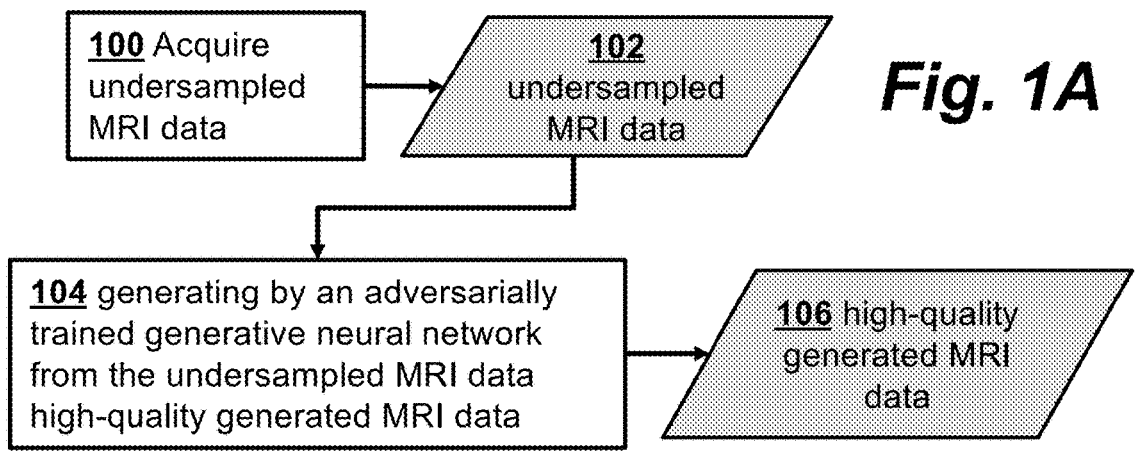

|  | PSNR | NRMSE | SSIM |
|---|---|---|---|
| GAN | 30.27±3.20 | 0.22±0.06 | 0.79±0.09 |
| CS-L1 | 28.80±4.72 | 0.28±0.18 | 0.76±0.11 |

MRI IMAGE RECONSTRUCTION FROM UNDERSAMPLED DATA USING ADVERSARIALLY TRAINED GENERATIVE NEURAL NETWORK

STATEMENT REGARDING FEDERALLY SPONSORED RESEARCH OR DEVELOPMENT

This invention was made with Government support under contract EB026136 awarded by the National Institutes of Health, and under contract EB009690 awarded by the National Institutes of Health. The Government has certain rights in the invention.

FIELD OF THE INVENTION

The present invention relates generally to magnetic resonance imaging (MRI). More specifically, it relates to methods for MRI image reconstruction using deep neural networks.

BACKGROUND OF THE INVENTION

Magnetic resonance imaging (MRI) is an important medical imaging technique. To acquire sufficient data in an MRI scan to reconstruct a high-quality image using conventional reconstruction techniques can result in very long scan times. MRI acquires data in the Fourier (k-space) domain over several readouts and requires several minutes per scan to acquire enough data to satisfy Shannon-Nyquist sampling rates.

To accelerate imaging, less data can be acquired in a process known as undersampling. Using non-linear reconstruction techniques such as compressed sensing (CS), parallel imaging, and deep learning, clinically-useful images can be recovered from the undersampled data.

In the case of deep learning-based reconstruction methods, existing techniques typically require fully-sampled ground truth data for supervised training. This poses a problem for applications such as dynamic contrast enhancement (DCE), 3D cardiac cine, and 4D flow, where the collection of fully-sampled datasets is time-consuming, difficult, or impossible. It remains a challenge to reconstruct high-quality images using deep learning where only undersampled data is available.

BRIEF SUMMARY OF THE INVENTION

This disclosure describes a deep learning framework for reconstructing MRI without using any fully sampled data. The method produces higher quality images which reveal vessels and recover more anatomical structure compared to compressed sensing. These results are demonstrated for an artificially undersampled knee fast spin echo and abdominal DCE. This method has potential in applications, such as DCE, cardiac cine, low contrast agent imaging, and real-time imaging. The deep learning framework uses a generative model for learned image reconstruction using only undersampled datasets and no fully-sampled datasets.

In one aspect, the invention provides a method of magnetic resonance imaging comprising: acquiring by an MRI scanner undersampled MRI data; and generating by a generative neural network from the undersampled MRI data generated MRI data having higher quality than the undersampled MRI data; wherein the generative neural network is adversarially trained using a discriminative neural network that distinguishes between i) undersampled MRI training data; and ii) candidate undersampled MRI training data produced by applying an MRI measurement function to generated MRI training data produced by the generative neural network from the undersampled MRI training data, wherein the measurement function comprises an undersampling mask.

In one implementation, the undersampled MRI data, the generated MRI data, the undersampled MRI training data, and the candidate undersampled MRI training data are represented in image space. In this implementation, acquiring the undersampled MRI data using the MRI scanner may include acquiring undersampled k-space data and mapping the undersampled k-space data to image space using zero-filled reconstruction. Also, in this implementation, the measurement function may include coil sensitivity maps, a Fourier transform, the undersampling mask, an inverse Fourier transform, and the coil sensitivity maps once more.

In another implementation, the undersampled MRI data, the generated MRI data, the undersampled MRI training data, and the candidate undersampled MRI training data are represented in k-space. In this implementation, the method may include mapping the generated MRI data from k-space to image space by applying an inverse Fourier transform and coil sensitivity maps.

The generative neural network may be implemented with multiple rounds of a set of blocks made of a data consistency block followed by convolution and ReLU blocks. This structure is an unrolled network based on the Iterative Shrinkage-Thresholding Algorithm. Alternatively, the generative neural network may be implemented with multiple pairs of convolution and ReLU blocks followed by a hyperbolic tangent block.

The discriminative neural network may be implemented with multiple pairs of convolution and ReLU blocks followed by a densely connected block.

In various implementations, the undersampled MRI data, the generated MRI data, the undersampled MRI training data, and the candidate undersampled MRI training data may represent 2D slices, 3D volumes, 4D datasets, or 2D slices plus a time dimension.

BRIEF DESCRIPTION OF THE SEVERAL VIEWS OF THE DRAWINGS

FIG. 1A is a processing pipeline illustrating an overview of a method of reconstructing high quality MRI data from undersampled MRI data using a generative neural network, according to an embodiment of the invention.

FIG. 1B is a processing pipeline illustrating an overview of a method of adversarially training a generative neural network for reconstructing high quality MRI data from undersampled data without using fully sampled training data, according to an embodiment of the invention.

DETAILED DESCRIPTION OF THE INVENTION

Figure 2A:
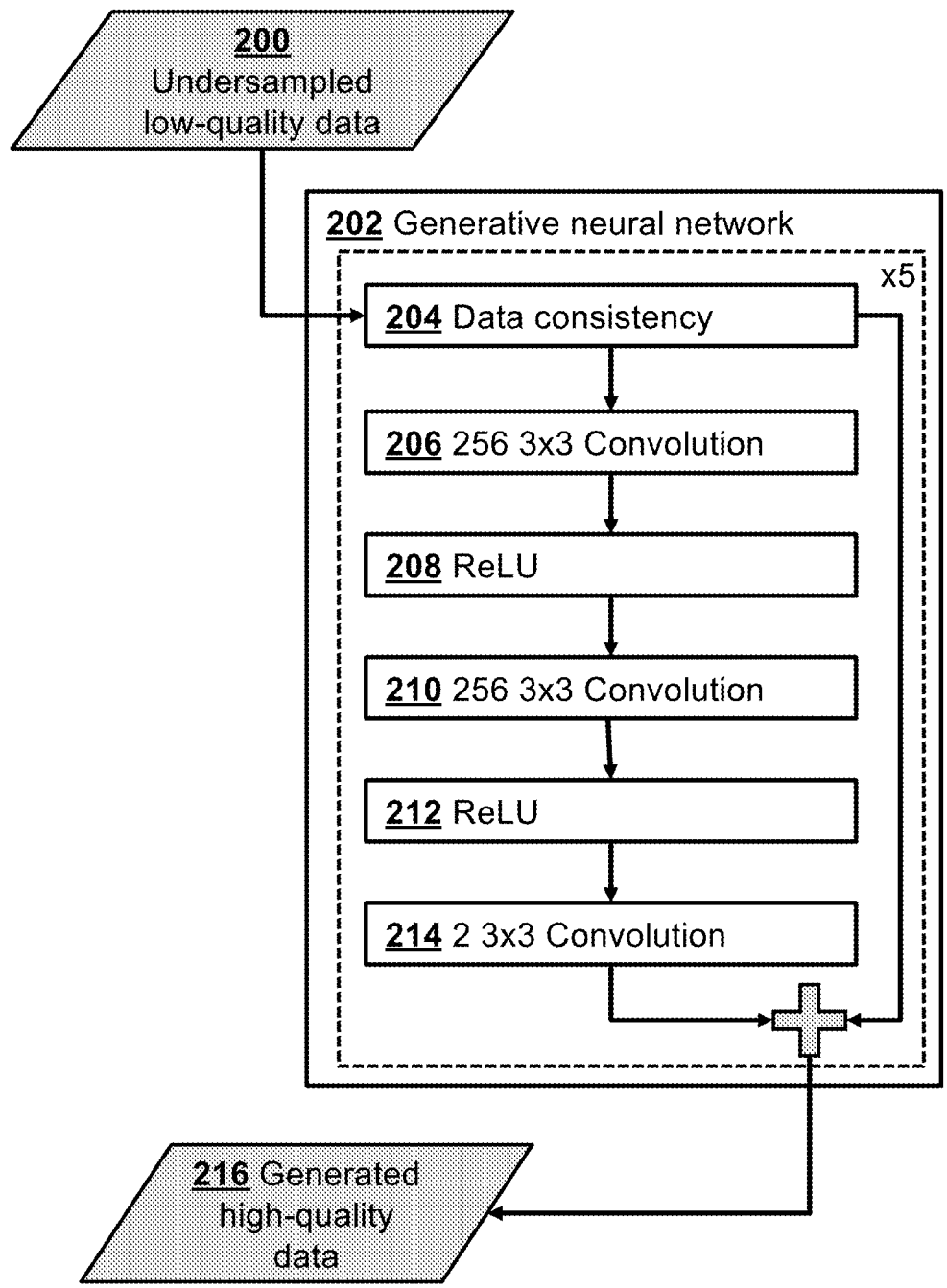
FIG. 2A is a processing pipeline illustrating an architecture for a generative neural network, which is an unrolled network based on the Iterative Shrinkage-Thresholding Algorithm, according to an embodiment of the invention.

FIG. 1A is a processing pipeline illustrating an overview of a method of reconstructing high quality MRI data from undersampled MRI data using a generative neural network, according to an embodiment of the invention. In step 100, an MRI scanner acquires undersampled MRI data 102. A generative neural network generates in step 104 generated MRI data 106 having higher quality than the undersampled MRI data 102.

In one implementation, the undersampled MRI data 102 and the generated MRI data 106 are both represented in image space. In this implementation, in step 100 the MRI scanner acquires undersampled k-space data and maps it to a 2D image in image space using conventional zero-filled reconstruction. In step 104 the generative neural network directly outputs the 2D image.

In another implementation, the undersampled MRI data 102 and the generated MRI data 106 are both represented in k-space. In this implementation, the undersampled k-space data is fed directly to the generative neural network as input. The network generates a high-quality k-space MRI data that is then mapped from k-space to image space by applying an inverse Fourier transform and coil sensitivity maps.

This reconstruction method has the advantage that it is capable of reconstructing images using a generative neural network trained only with undersampled datasets.

FIG. 1B is a processing pipeline illustrating an overview of a method of adversarially training a generative neural network for reconstructing high quality MRI data from undersampled data without using fully sampled training data, according to an embodiment of the invention. The adversarial training technique adapts an approach based on Wasserstein GAN with gradient penalty (WGAN-GP).

A training set of undersampled MRI data 110 is obtained from multiple undersampled acquisitions. Depending on the implementation, the MRI data 110 may be represented as the original acquired k-space data or as complex-valued image space data obtained by zero-filled reconstruction from the acquired k-space data. The training could also alternate between image space data and k-space data using a cross-domain convolutional neural networks, such as KIKI-net. The training is thus not limited to operating in one domain or the other exclusively.

Undersampled MRI training data 112 and 124 are sequentially selected from the training set 110 during the training. The selection of undersampled training data 112 is provided as input to generative neural network 114. The generative network 114 generates from the undersampled data 112 high-quality data 120, which is then applied to an MRI measurement function 120 that includes an undersampling mask. The output of the MRI measurement function 120 is candidate undersampled MRI data 122, which is fed as input to the discriminative network 116. During training, the selection of undersampled training data 124 is also provided as input to the discriminative neural network 116. The discriminator 116 distinguishes between the actual undersampled MRI training data 124 and the candidate undersampled MRI training data 122 produced by applying the MRI measurement function 120 to the generated MRI data 118 that was produced by the generative neural network 114 from the actual undersampled MRI training data 112. The discriminator 116 differentiates between generated and real measured images. The gradients from minimizing the loss functions of the discriminator and generator 126 are back-propagated into the generator 114.

Figure 2B:
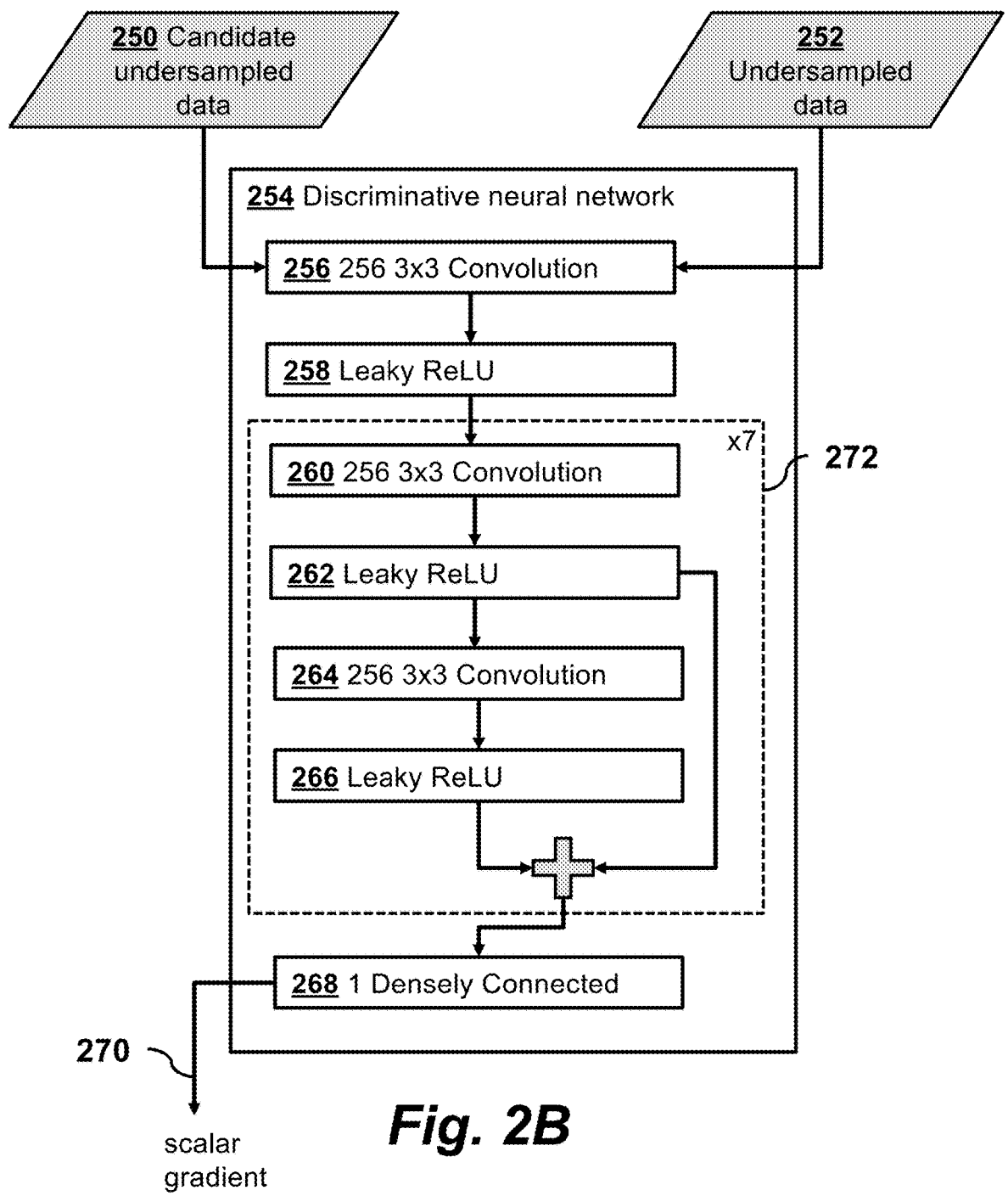
FIG. 2B is a processing pipeline illustrating an architecture for a discriminator neural network, which uses leaky ReLU in order to backpropagate small negative gradients into the generator, according to an embodiment of the invention.

The discriminative neural network 116 may be implemented as shown in FIG. 2B. Candidate undersampled data 250 and actual undersampled data 252 are separately fed as input to the discriminator 254. The architecture of the discriminator 254 has multiple pairs of convolution and leaky ReLU blocks, 256 and 258, 260 and 262, 264 and 266, followed by a densely connected block 268 that outputs a scalar gradient 270 for backpropagation to the generator. There is a feedforward from leaky ReLU block 262 that is added to the output of leaky ReLU block 266. The blocks 260, 262, 264, 266 and feedforward are repeated seven times. This discriminator architecture may be used for an implementation where the input data are represented in image space or represented in k-space.

FIG. 2A is a processing pipeline illustrating an architecture for a generative neural network 202, which is an unrolled network based on an adaptation of the Iterative Shrinkage-Thresholding Algorithm, according to an embodiment of the invention. The generator 202 takes as input undersampled low-quality data 200 and generates as output high-quality data 216.

In an implementation where the input and output data is represented in image space, the network has a data consistency block 204, followed by a 256 3×3 convolution block 206 followed by an ReLU block 208 followed by another 256 3×3 convolution block 210 and ReLU block 212 and ending with a 2 3×3 convolution block 214. The output of the data consistency block 204 is forwarded and added to the output of the 2 3×3 convolution block 214. The six blocks are repeated five times.

In an implementation where the input and output data is represented in k-space, 256 3×3 convolution blocks 206 and 210 are replaced by a 128 3×3 convolution block, and 2 3×3 convolution block 214 is replaced by a 2Y 3×3 convolution block, where Y is the number of coils.

Figure 2C:
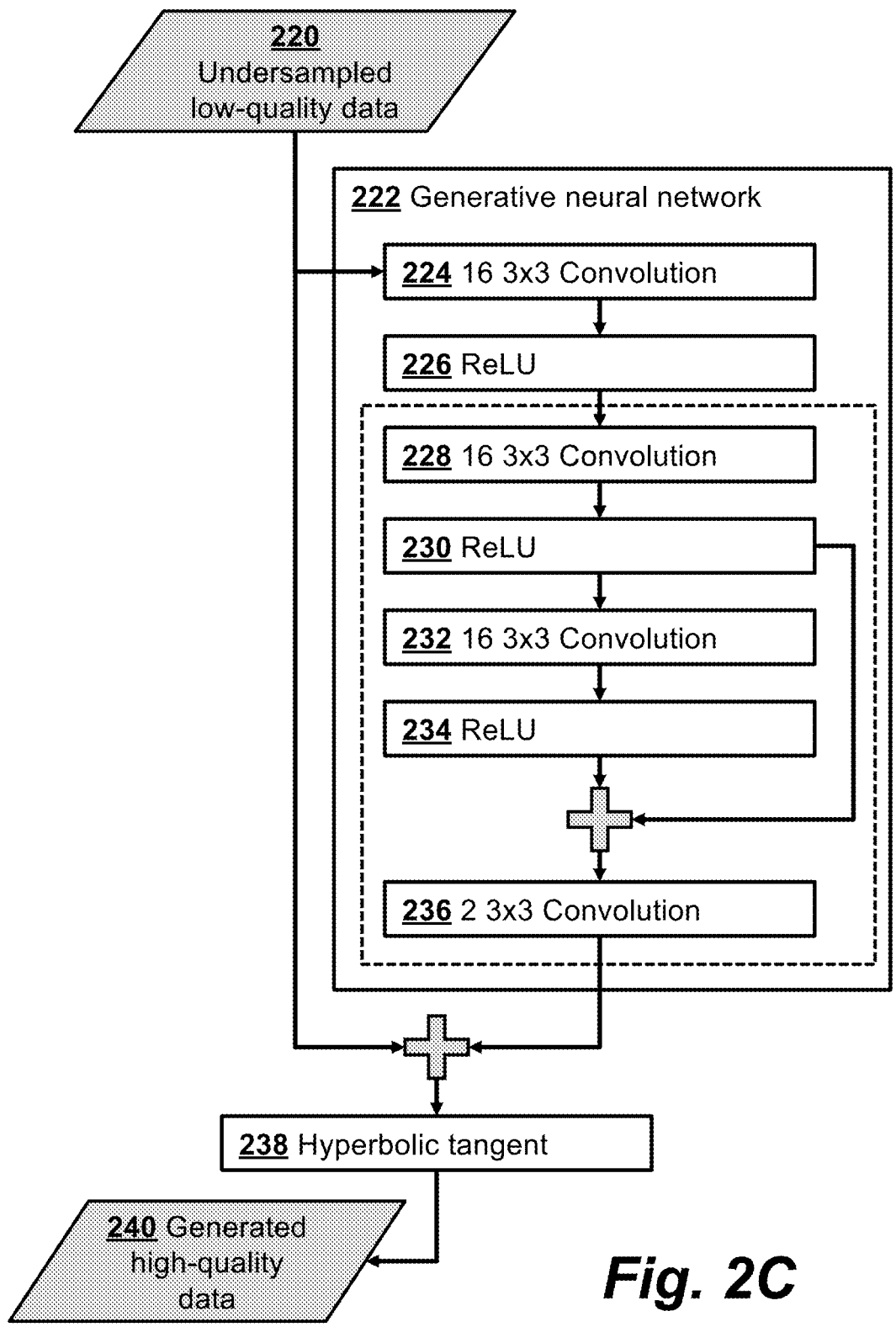
FIG. 2C is a processing pipeline illustrating an architecture for a generative neural network, according to an alternate embodiment of the invention.

FIG. 2C is a processing pipeline illustrating an architecture for a generative neural network, according to an alternate embodiment of the invention where the data is represented in image space. The generator 222 takes as input undersampled low-quality data 220 and generates as output high-quality data 240. In an implementation where the input and output data is represented in image space, the generative neural network may be realized with multiple pairs of convolution and ReLU blocks and a hyperbolic tangent block. Specifically, 16 3×3 convolution 224 followed by ReLU block 226, followed by 16 3×3 convolution 228 followed by ReLU block 230, followed by 16 3×3 convolution 232 followed by ReLU block 234 whose output is added to a feedforward from ReLU block 230 the result of which is input to 2 3×3 convolution 236. The blocks 228, 230, 232, 234, 236 are repeated five times. The output of these are added with the original undersampled data 220 and input to a hyperbolic tangent block 238 to produce the generated high-quality data 240.

The loss functions of the generator and discriminator are adapted from the Wasserstein GAN with gradient penalty (WGAN-GP). The discriminator loss function is $$D_{loss} = D(\text{generated data}) - D(\text{actual data}) + GP$$

where D(•) is the output scalar of the discriminator which is the measure of how much the discriminator believes the generated data is in the learned distribution of the actual data, and GP is the gradient penalty. The gradient loss function is $$G_{loss} = -D(\text{generated data}).$$

The loss functions of the generator and discriminator could take various forms. Some other variants include the loss functions of WGAN without added gradient penalty and DCGAN (Deep Convolutional Generative Adversarial Networks).

Figure 2D:
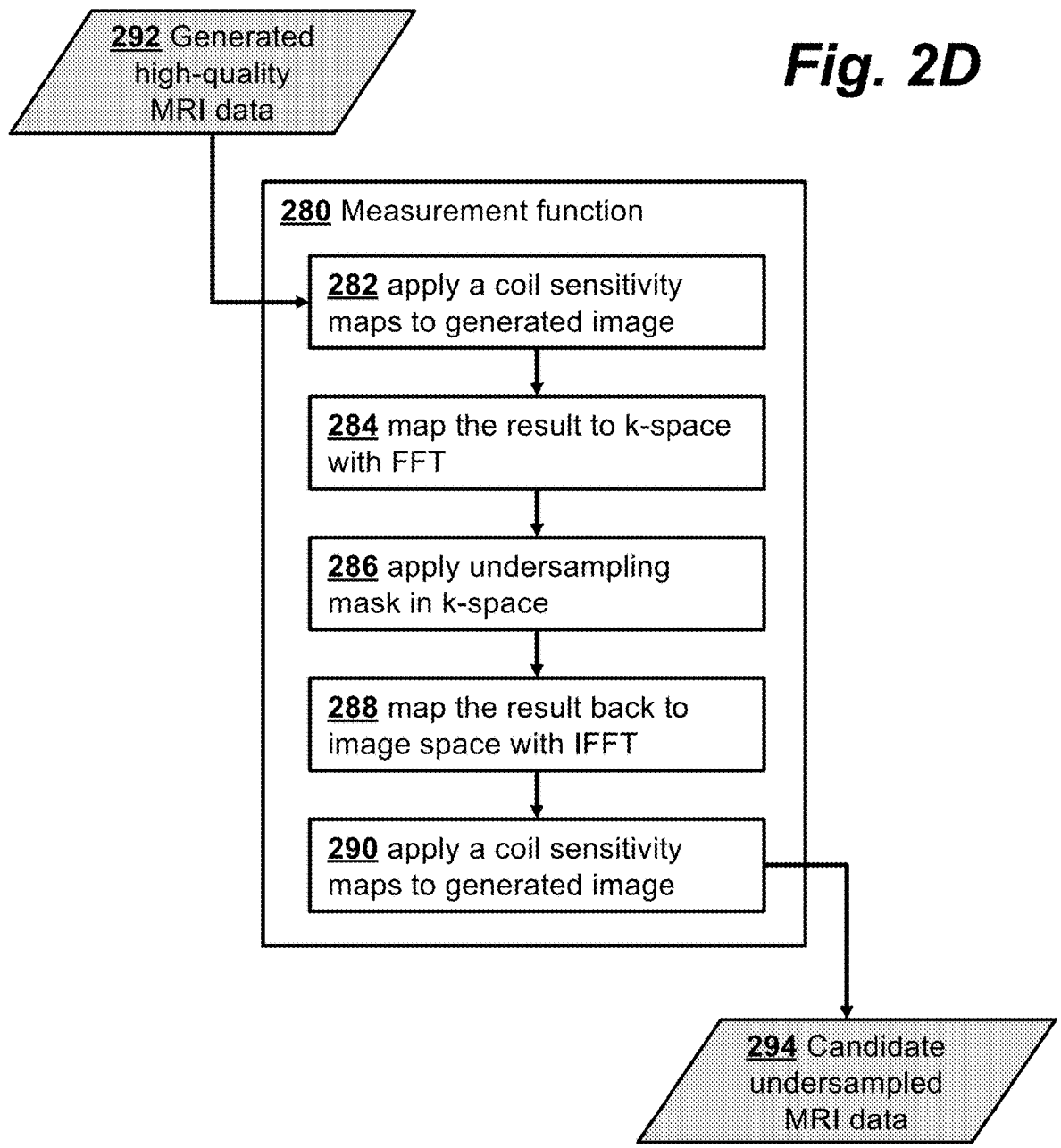
FIG. 2D is a processing pipeline illustrating a measurement function acting on MRI data in image space, according to an embodiment of the invention.

FIG. 2D is a processing pipeline illustrating a measurement function acting on generated MRI data to produce candidate undersampled data, according to an embodiment of the invention. In this implementation, the generated high-quality MRI data 292 and the candidate undersampled MRI data 294 are represented in image space. In step 282, the measurement function applies coil sensitivity maps to the generated data 292. In step 284, the result is mapped by a Fourier transform to k-space, an undersampling mask is applied in step 286, an inverse Fourier transform maps the masked data back to image space in step 288, and second coil sensitivity maps are applied to the image space data in step 290 to produce the candidate undersampled data 294. The coil sensitivity maps may be generated using ESPIRiT.

In another implementation, where the generated high-quality MRI data 292 and the candidate undersampled MRI data 294 are represented in k-space, the measurement function 280 is simply the undersampling mask 286 alone.

More generally, in the k-space embodiments, the generator and discriminator networks are adapted such that the number of channels is the number of coils in the k-space data multiplied by 2, to represent the real and imaginary parts.

The architecture of the generator and discriminator could have various different architectures than the ones shown here. In general, the architectures of the generator and discriminator have enough representational capacity in order to learn the underlying distributions of the training MRI data. This involves having enough feature maps and residual blocks if a residual structure is used.

Further variations could include: various activation functions for the generator and discriminator, the number of steps that the generator and discriminator are each trained for, and other parameters such as number of epochs to train and learning rate. Candidate activation functions for the generator and discriminator include ReLU, leaky ReLU, sigmoid, and the hyperbolic tangent. Further activation functions could include complex-valued activation functions, such as modReLU, zReLU, and CReLU, which may help preserve the phase of the MRI data. Additionally, the representational power and the training of the generator and discriminator should be balanced such that the GAN does not become unstable or go into mode collapse, which are common problems in GAN training. This could involve training the discriminator for more steps than the generator, or vice versa, depending on the data and the architectures of each network. This could also involve constructing the discriminator with 64 feature maps and the generator with 256 feature maps, for example, so that they do not become imbalanced. An appropriate learning rate is selected to prevent this potential instability.

The framework was tested in two scenarios. The first test acquired MRI data from 15 subjects; each subject had a complex-valued volume of size 320×320×256 that was split into axial slices. Fully sampled 3T knee images were acquired using a 3D FSE CUBE sequence with proton density weighting including fat saturation. Using a fully-sampled ground truth for the test allows the results to be quantitatively validated. Undersampled images for training were created by applying pseudo-random Poisson-disc variable-density sampling masks to the fully-sampled k-space. Thus, although fully-sampled datasets were used to create undersampled datasets, the generator and discriminator were never trained with fully-sampled data.

The second scenario used dynamic contrast enhanced (DCE) acquisitions of the abdomen, with a fat-suppressed butterfly-navigated free-breathing SPGR acquisition with an acceleration factor of 5. Data from a total of 886 subjects were used for training. Because DCE is inherently undersampled, there was no fully sampled ground truth to assess performance in this test. Instead, the results were compared to CS reconstruction, and the sharpness of the vessels and other anatomical structures in the generated images were qualitatively evaluated.

Figure 3:
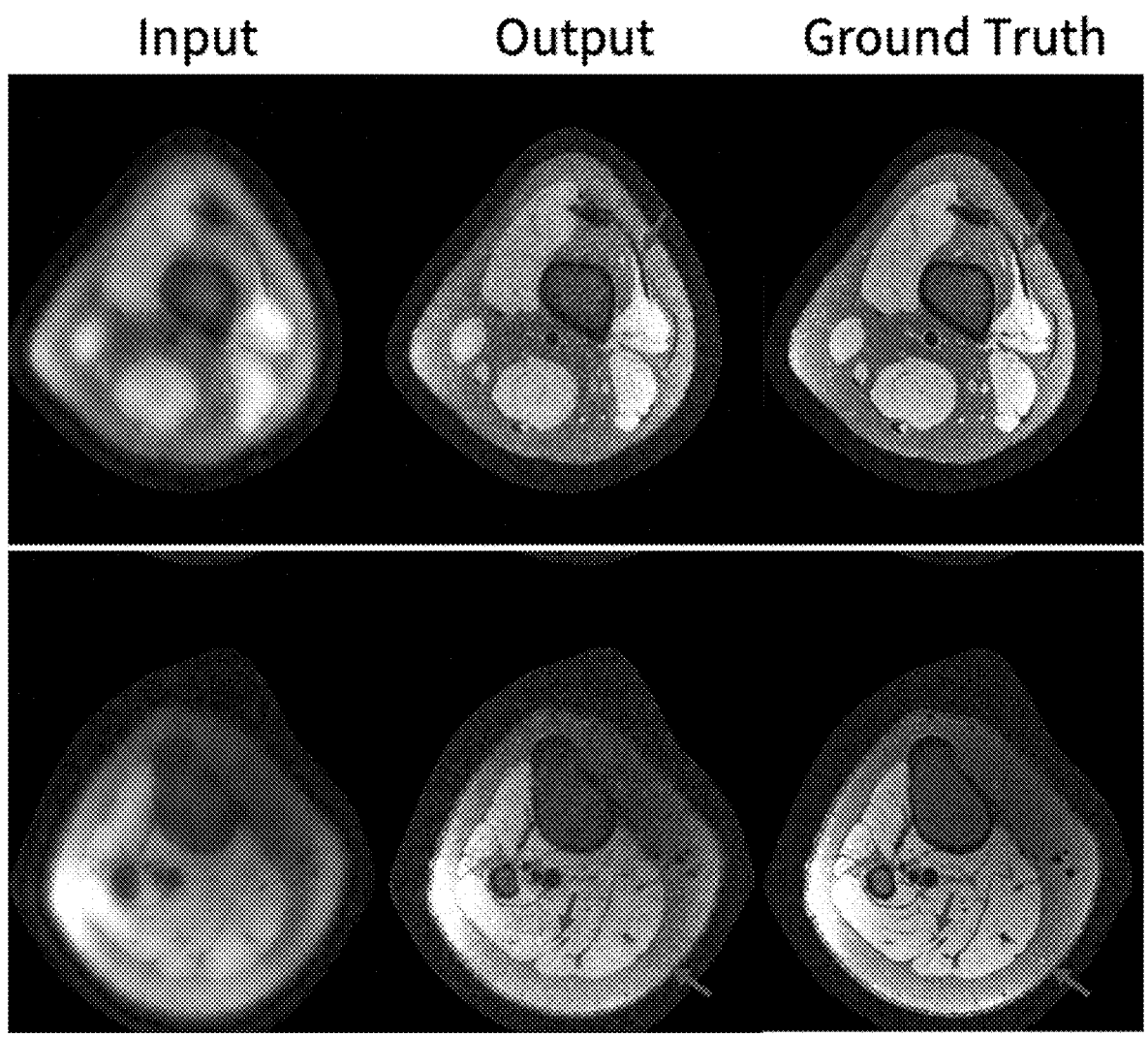
FIG. 3 are MRI images showing input, output, and ground truth images for a test knee, according to an embodiment of the invention.

Two representative results in the knee scenario are shown in the two rows of FIG. 3 with an undersampling factor of 2 in both $k_y$ and $k_z$. The three MRI images in each row show, from left to right, the input undersampled complex image to the generator, the high-quality generated output image from the generator network, and the original fully-sampled ground truth image. As is evident from the images, the generator network significantly improves the image quality by recovering vessels and structures that were not visible before, producing generated images quite similar in quality to the ground truth. Surprisingly, it accomplishes this using no ground truth data in the training.

Figures 4, 5:
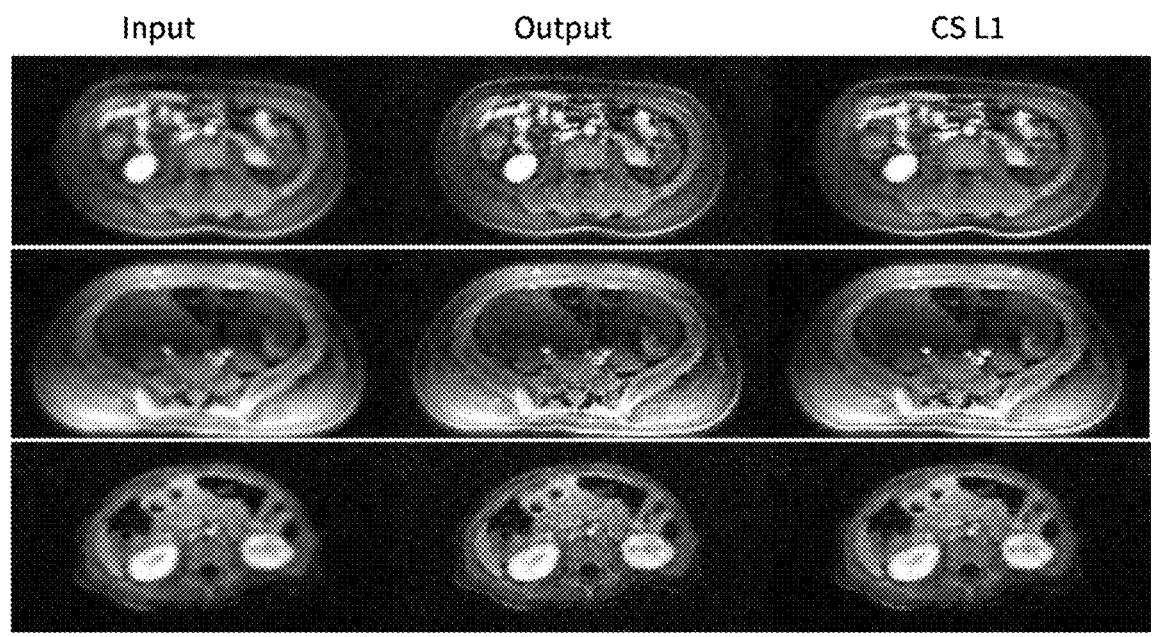
FIG. 4 is a table of statistical measures of reconstructed images on a test dataset comparing results of the present techniques and compressed sensing with L1-wavelet regularization.
FIG. 5 shows MRI images of representative DCE results, comparing undersampled image input, generated output using the present techniques, and output using compressed sensing.

FIG. 4 is a table comparing statistics for generated images using the GAN techniques of the present invention (first row) with those of CS with L1-wavelet regularization (second row) for a test knee dataset of three subjects. The three columns show the mean and standard deviation of the peak signal to noise ratio (PSNR), normalized root mean squared error (NRMSE), and structural similarity (SSIM), where each is a comparison between the ground truth and generated images.

FIG. 5 shows in three rows three representative image results from the second scenario (DCE). The left slice in each row is an undersampled complex image input to the generator, the middle slice in each row is the generated output image of the generator, and the right slice in each row is an image reconstructed using compressed sensing L1-wavelet regularization. As is evident from the images, the generator network significantly improves the image quality by recovering sharpness and adding more structure to the undersampled input images. The generated images are sharper than those reconstructed by CS and have higher diagnostic quality.

A significant advantage of the methods of the present invention over existing deep learning MRI reconstruction methods is it avoids the need for fully-sampled data and can thus be used in cases where existing methods cannot, i.e., when fully-sampled datasets are difficult to obtain or unavailable. Additionally, the method produces better quality reconstruction compared to baseline CS methods.

While the method has been demonstrated here for reconstructing undersampled fast spin echo and DCE datasets, the discriminator can act on any simulated lossy measurement as long as the measurement process is known. Therefore, this method could also be useful for real-time imaging due to motion and arterial spin labeling due to low SNR. Further applications where it is hard to fully sample are time-resolved MR angiography, cardiac cine, low contrast agent imaging, EPI-based sequences, diffusion tensor imaging, and fMRI.

It should be noted that the techniques of the present invention can be applied to many different dimensionalities and applications, and can thus be demonstrated for 2D slices, 3D volumes, 4D datasets, and 2D slices plus a time dimension. The case of 2D slices was described above for the knee scenario. The case of 2D plus time is the DCE application because in DCE it is desired to track the contrast moving through the abdomen over a period of time. To adapt the technique for this case, all that is needed is to add a time dimension at the end of the architecture of the generator and discriminator. So, if for 2D slices the dimensions are [batch size, height, width, channels], for 2D plus time, the dimensions would be [batch size, height, width, time, channels]. Each DCE dataset had 18 time frames.

For 3D volumes, again, the architectures would just need to be extended into three dimensions: [batch size, height, width, length, channels]. An example application of a 3D dataset could simply be training on the entire volume of a patient instead of taking slices. For higher dimensions, a good example application is 4D flow because there are three spatial dimensions, three velocity dimensions, and one time dimension.

The invention claimed is:

1. A method of magnetic resonance imaging (MRI) comprising:
   acquiring by an MRI scanner undersampled MRI data;
   generating by a generative neural network generated MRI data from the undersampled MRI data, wherein the generated MRI data has higher quality than the undersampled MRI data;
   wherein the generative neural network is adversarially trained without using fully-sampled training data using a discriminative neural network that distinguishes between
   i) undersampled MRI training data; and
   ii) candidate undersampled MRI training data produced by applying an MRI measurement function to generated MRI training data produced by the generative neural network from the undersampled MRI training data, wherein the measurement function comprises an undersampling mask.

2. The method of claim 1 wherein the undersampled MRI data, the generated MRI data, the undersampled MRI training data, and the candidate undersampled MRI training data are represented in image space.

3. The method of claim 1 wherein acquiring by the MRI scanner the undersampled MRI data comprises acquiring undersampled k-space data and mapping the undersampled k-space data to image space using zero-filled reconstruction.

4. The method of claim 1 wherein the measurement function comprises coil sensitivity maps, a Fourier transform, the undersampling mask, an inverse Fourier transform, and the coil sensitivity maps again.

5. The method of claim 1 wherein the undersampled MRI data, the generated MRI data, the undersampled MRI training data, and the candidate undersampled MRI training data are represented in k-space.

6. The method of claim 1 further comprising mapping the generated MRI data from k-space to image space by applying an inverse Fourier transform and coil sensitivity maps.

7. The method of claim 1 wherein the generative neural network comprises a data consistency block followed by convolution and ReLU blocks.

8. The method of claim 1 wherein the generative neural network comprises multiple pairs of convolution and ReLU blocks followed by a hyperbolic tangent block.

9. The method of claim 1 wherein the discriminative neural network comprises multiple pairs of convolution and ReLU blocks followed by a densely connected block.

10. The method of claim 1 wherein the undersampled MRI data, the generated MRI data, the undersampled MRI training data, and the candidate undersampled MRI training data represent 2D slices, 3D volumes, 4D datasets, or 2D slices plus a time dimension.

* * * * *